(12) United States Patent
Tang et al.

(10) Patent No.: US 8,300,411 B2
(45) Date of Patent: Oct. 30, 2012

(54) FAN MOUNTING APPARATUS

(75) Inventors: Xian-Xiu Tang, Shenzhen (CN);
Zhen-Xing Ye, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 201 days.

(21) Appl. No.: 12/962,585

(22) Filed: Dec. 7, 2010

(65) Prior Publication Data

US 2012/0120601 A1    May 17, 2012

(30) Foreign Application Priority Data

Nov. 17, 2010 (CN) .......................... 2010 1 0547915

(51) Int. Cl.
*H05K 7/20* (2006.01)
(52) U.S. Cl. ...................... 361/694; 415/214.1; 454/184
(58) Field of Classification Search ............. 361/679.46, 361/679.48, 679.49, 679, 5, 694, 695; 454/184
See application file for complete search history.

(56) References Cited

U.S. PATENT DOCUMENTS

| 6,183,214 | B1 * | 2/2001 | Ko .............................. 417/360 |
| 6,244,953 | B1 * | 6/2001 | Dugan et al. ................. 454/184 |
| 6,493,225 | B2 * | 12/2002 | Chuang et al. ............... 361/695 |
| 7,874,348 | B2 * | 1/2011 | Liu et al. ...................... 165/121 |
| 2002/0060900 | A1 * | 5/2002 | Qiu .............................. 361/683 |
| 2003/0214784 | A1 * | 11/2003 | Pauser .......................... 361/695 |
| 2010/0014243 | A1 * | 1/2010 | Tsai et al. ................. 361/679.47 |
| 2011/0135448 | A1 * | 6/2011 | Chen ............................. 415/119 |

\* cited by examiner

*Primary Examiner* — Gregory Thompson
(74) *Attorney, Agent, or Firm* — Altis Law Group, Inc.

(57) ABSTRACT

A mounting apparatus for fixing a fan defining fixing notches in an exterior surface of the fan to a chassis includes a frame. The frame includes a base panel fixed to the chassis, two side panels respectively extending up from opposite ends of the base panel, and two elastic fixing portions respectively extending up from the side panels away from the base panel. When the fan is disposed in the frame, the base panel, the side panels, and the fixing portions of the frame resist the exterior surface of the fan and the fixing portions are received in the corresponding fixing notches of the fan.

19 Claims, 4 Drawing Sheets

FAN MOUNTING APPARATUS

BACKGROUND

1. Technical Field

The present disclosure relates to a fan mounting apparatus.

2. Description of Related Art

Often, a fan is fixed in a housing of an electronic device to dissipate heat from heat-generating components within the housing. However, the structure for fixing the fan to the housing can hinder efficient airflow from the fan toward the heat-generating components, which decreases heat dissipating efficiency of the fan.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
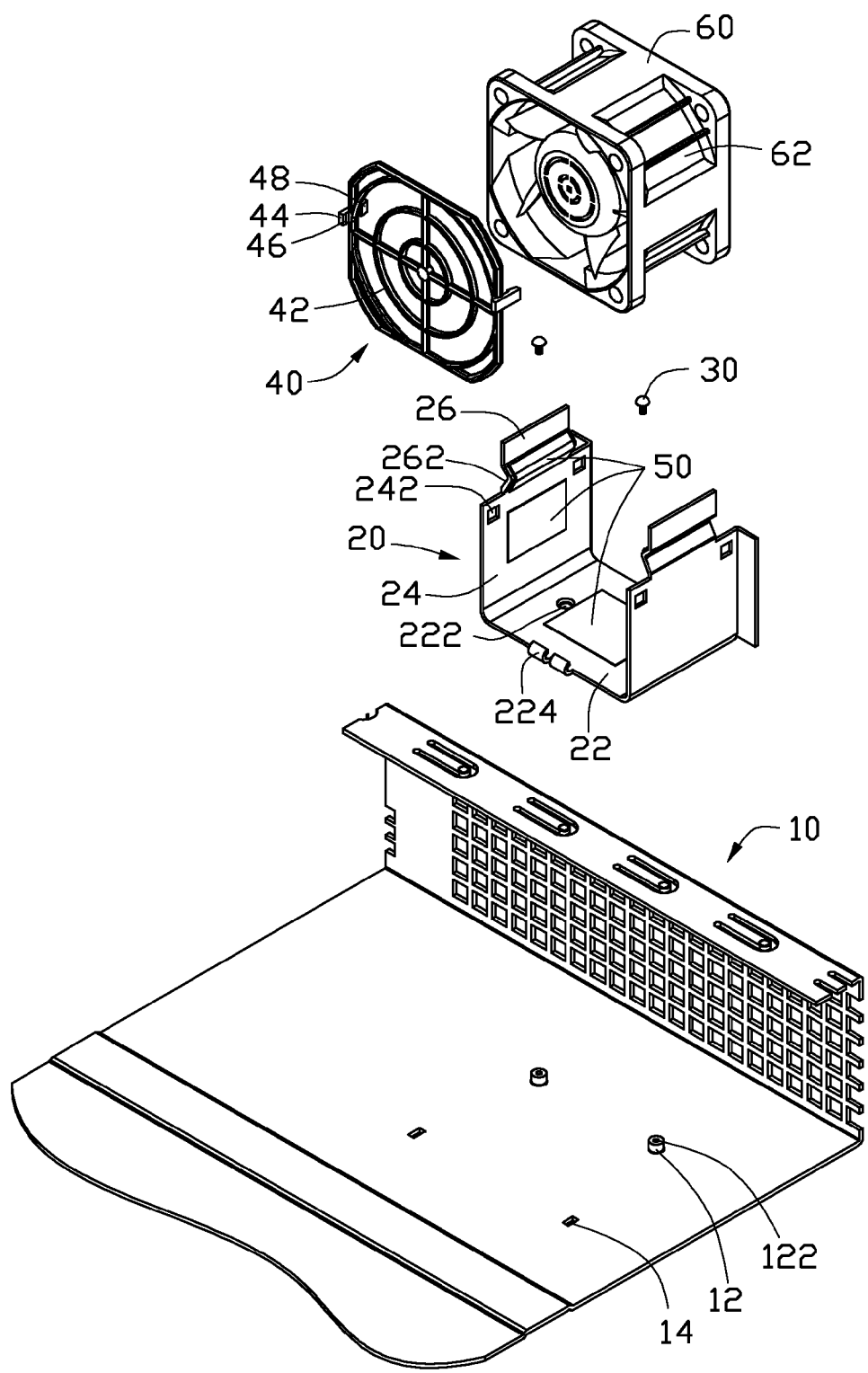
FIG. 1 is an exploded, isometric view of an exemplary embodiment of a mounting apparatus together with a fan.

Referring to FIG. 1, a mounting apparatus in accordance with an exemplary embodiment fixes a fan 60 to a chassis 10 of an electronic device. A plurality of fixing notches 62 is defined in an exterior surface of the fan 60. Two posts 12, each defining a fixing hole 122, protrude from a bottom of the chassis 10. Two latching holes 14 are defined in the bottom of the chassis 10 adjacent to the posts 12.

The mounting apparatus includes an elastic frame 20, a protecting cover 40, and a plurality of shockproof pads 50 adhering to inner surfaces of the frame 20.

The frame 20 includes a base panel 22, two side panels 24 extending up from opposite ends of the base panel 22, and two elastic locking portions 26 respectively extending up from the side panels 24 opposite to the base panel 22. Two through holes 222 are defined in the base panel 22 corresponding to the posts 12 of the chassis 10. Two curved hooks 224 are formed at a side of the base panel 22, pivotally mounting the protecting cover 40 to the frame 20. A retaining hole 242 is defined in each side panel 24. Each locking portion 26 includes a substantially V-shaped fixing portion 262 protruding from a top of a corresponding side panel 24 opposite to the base panel 22.

The protecting cover 40 includes a wire net 42 and two elongated arms 44 respectively formed at opposite second and third sides of the wire net 42. A first catch 46 and a second catch 48 protrude from opposite ends of each arm 44, corresponding to one latching hole 14 of the chassis 10 and one retaining hole 242 of the frame 20.

In the embodiment, the shockproof pads 50 adhere to inner surfaces of the base panel 22, of the side panels 24, and of the locking portions 26.

Figure 2:
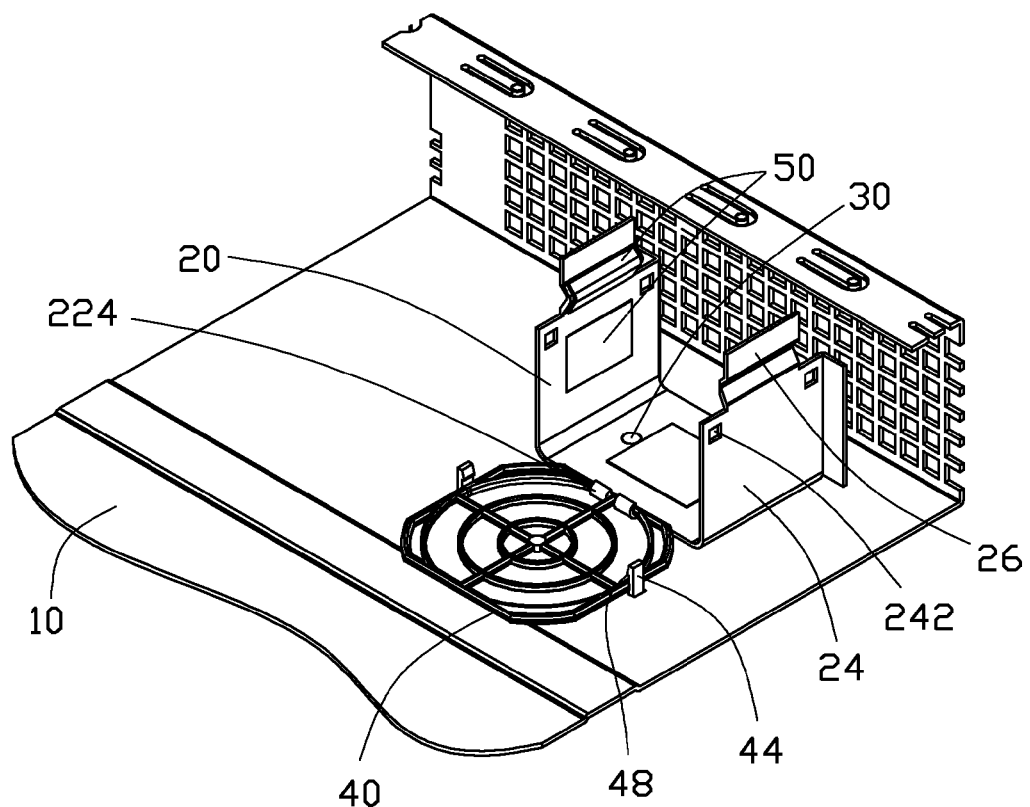
FIG. 2 is an assembled, isometric view of the mounting apparatus of FIG. 1.

Referring to FIG. 2, in assembly, the frame 20 is put on the bottom of the chassis 10, with the posts 12 extending into the corresponding through holes 222. Two fasteners 30, such as two screws, respectively extend through the through holes 222 and engage in the fixing holes 122 of the corresponding posts 12, thereby the frame 20 being fixed to the chassis 10. A first side substantially perpendicularly connected between the second and third sides of the wire net 42 is pivotally fitted about by the hooks 224 of the frame 20, and thus the protecting cover 40 is pivotally secured to the frame 20. The protecting cover 40 pivots toward the bottom of the chassis 10, with the first catches 46 of the arms 44 received in the corresponding latching holes 14 of the chassis 10. The protecting cover 40 is disposed on the bottom of the chassis 10, substantially parallel to the base panel 22 of the frame 20.

Figure 3:
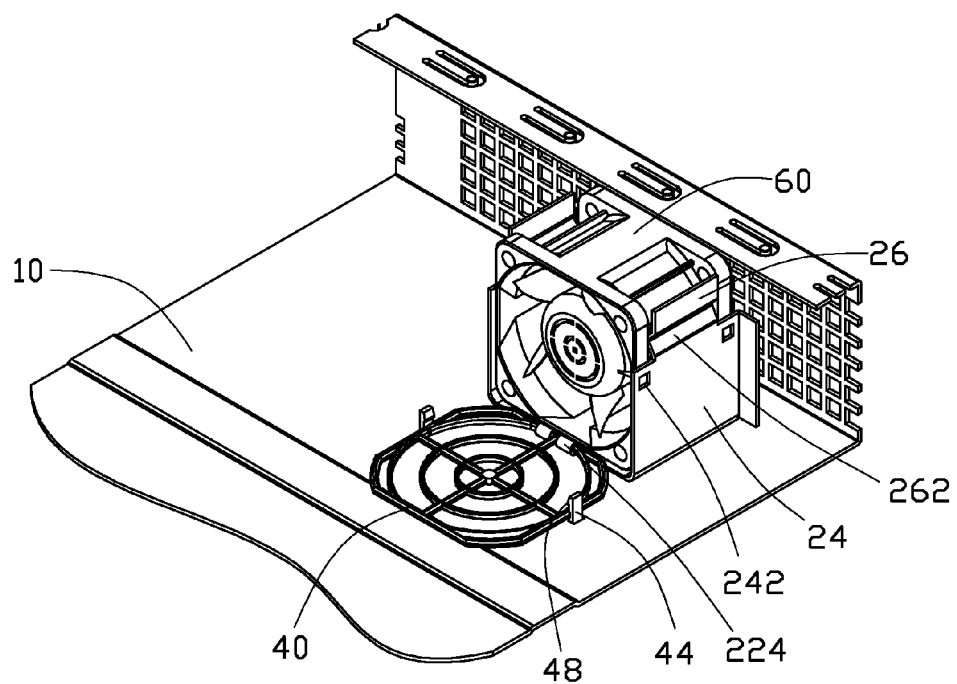
FIG. 3 is an assembled, isometric view of the mounting apparatus and the fan of FIG. 1.
Figure 4:
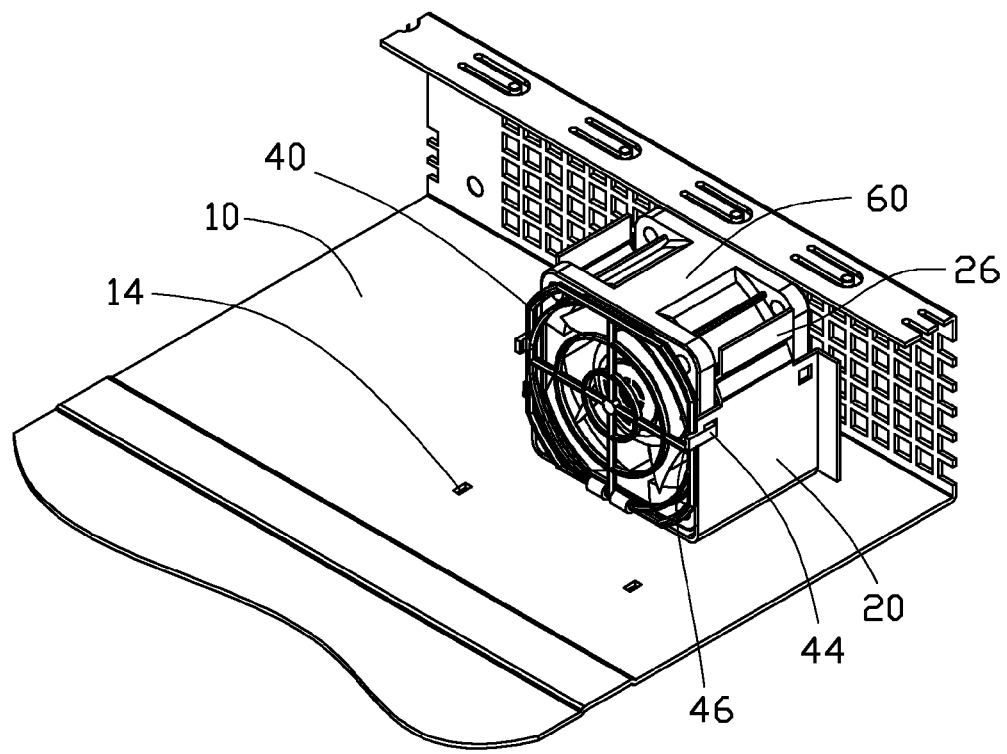
FIG. 4 is similar to FIG. 3, but showing another state.

Referring to FIGS. 3 and 4, the fan 60 is placed between the locking portions 26 of the frame 20, and is pressed toward the base panel 22 of the frame 20. The locking portions 26 are deformed to move away from each other, and the fan 60 enters between the side panels 24 of the frame 20. The locking portions 26 are restored to allow the fixing portions 262 to be received into the corresponding fixing notches 62 of the fan 60. Thus, the fan 60 is fixed to the frame 20, with the shockproof pads 50 on the base panel 22, the side panels 24, and the locking portions 26 of the frame 20 resisting the exterior surface of the fan 60. The arms 44 of the protecting cover 40 are deformed to allow the first catches 46 to escape from the corresponding latching holes 14 of the chassis 10. The protecting cover 40 pivots toward the frame 20. The second catches 48 of the arms 44 are respectively received in the retaining holes 242 of the corresponding side panels 24 of the frame 20. The protecting cover 40 is attached to the frame 20, substantially perpendicular to the base panel 22 and the side panels 24 of the frame 20, thereby preventing entry of foreign objects into the fan 60.

Because the base panel 22, the side panels 24, and the locking portions 26 of the frame 20 are located on the exterior surface of the fan 60, resistance to airflow therefrom is reduced and heat-generating components in the chassis 10 are cooled quickly, and heat dissipation efficiency of the fan 60 is maximized.

In other embodiments, the protecting cover 40 may be disposed on the chassis or removed, further increasing airflow from the fan 60 toward the heat-generating components in the chassis 10.

It is to be understood, however, that even though numerous characteristics and advantages have been set forth in the foregoing description of embodiments, together with details of the structures and functions of the embodiments, the present disclosure is illustrative only and changes may be made in detail, especially in matters of shape, size, and arrangement of parts within the principles of the present disclosure to the full extent indicated by the broad general meaning of the terms in which the appended claims are expressed.

What is claimed is:

1. A mounting apparatus for fixing a fan defining a plurality of fixing notches in an exterior surface of the fan to a chassis, the mounting apparatus comprising:

a frame comprising a base panel fixed to the chassis, two side panels respectively extending up from opposite ends of the base panel, and two elastic fixing portions respectively extending up from the side panels away from the base panel;

wherein when the fan is disposed in the frame, the base panel, the side panels, and the fixing portions of the frame resist the exterior surface of the fan and the fixing portions are received in the corresponding fixing notches of the fan.

2. The mounting apparatus of claim 1, wherein each of the fixing portions is substantially V-shaped.

3. The mounting apparatus of claim 1, further comprising a protecting cover pivotally attached to the frame.

4. The mounting apparatus of claim 3, wherein two hooks are formed on the base panel, the protecting cover comprises a first side pivotally attached to the hooks.

5. The mounting apparatus of claim 4, wherein the protecting cover comprises two arms respectively formed at opposite second and third sides substantially perpendicularly connected to opposite ends of the first side, a first catch protrudes from each of the arms configured for being received in the chassis.

6. The mounting apparatus of claim 5, wherein a retaining hole is defined in each of the side panels, a second catch protrudes from each of the arms for being received in the corresponding retaining hole.

7. The mounting apparatus of claim 1, further comprising a plurality of shockproof pads adhering to inner surfaces of the base panel, the side panels, and the fixing portions of the frame, for resisting the exterior surface of the fan when the fan is disposed in the frame.

8. An electronic device comprising:
a chassis;
a fan defining a plurality of fixing notches in an exterior surface of the fan; and
a frame comprising a base panel fixed to the chassis, two side panels respectively extending up from opposite ends of the base panel, and two elastic fixing portions respectively extending up from the side panels away from the base panel;
wherein when the fan is disposed in the frame, the base panel, the side panels, and the fixing portions of the frame resist the exterior surface of the fan and the fixing portions are received in the corresponding fixing notches of the fan.

9. The electronic device of claim 8, wherein each of the fixing portions is substantially V-shaped.

10. The electronic device of claim 8, further comprising a protecting cover pivotally attached to the frame, to enclose the fan with the frame.

11. The electronic device of claim 10, wherein two curved hooks are formed on the base panel, the protecting cover comprises a first side pivotally fitted about by the hooks.

12. The electronic device of claim 11, wherein the chassis defines two latching holes, the protecting cover comprises two arms respectively formed at opposite second and third sides substantially perpendicularly connected to opposite ends of the first side, a first catch protrudes from each of the arms to be detachably received in a corresponding one of the latching holes of the chassis.

13. The electronic device of claim 12, wherein a retaining hole is defined in each of the side panels, a second catch protrudes from each of the arms for being detachably received in the corresponding retaining hole.

14. The electronic device of claim 8, further comprising a plurality of shockproof pads adhering to inner surfaces of the base panel, the side panels, and the fixing portions of the frame, to resist the exterior surface of the fan when the fan is disposed in the frame.

15. An electronic device comprising:
a chassis;
a fan;
a frame comprising a base panel fixed to the chassis, two side panels respectively extending up from opposite ends of the base panel; and
a protecting cover movable between a first position where the protecting cover is attached to the chassis and substantially parallel to the base panel of the frame, and a second position where the protecting cover is attached to the frame to enclose the fan with the frame and substantially perpendicular to the base panel and the side panels of the frame.

16. The electronic device of claim 15, further comprising a plurality of shockproof pads adhering to inner surfaces of the base panel and the side panels, to resist the exterior surface of the fan.

17. The electronic device of claim 15, wherein two curved hooks are formed on the base panel, the protecting cover comprises a first side pivotally fitted about by the hooks.

18. The electronic device of claim 15, wherein the chassis defines two latching holes, the protecting cover comprises two arms respectively formed at opposite second and third sides substantially perpendicularly connected to opposite ends of the first side, a first catch protrudes from each of the arms and is received in a corresponding one of the latching holes of the chassis when the protecting cover is in the first position.

19. The electronic device of claim 18, wherein a retaining hole is defined in each of the side panels, a second catch protrudes from each of the arms and is received in the corresponding retaining hole when the protecting cover is in the second position.

* * * * *